United States Patent
Liu et al.

(10) Patent No.: US 9,977,089 B2
(45) Date of Patent: May 22, 2018

(54) CHARGER SYSTEM FOR BATTERY STARTING CURRENT TEST

(71) Applicant: NEW FOCUS LIGHTING & POWER TECHNOLOGY (SHANGHAI) CO., LTD, Shanghai (CN)

(72) Inventors: Yu Liu, Shanghai (CN); Shiquan Gong, Shanghai (CN); Jianxing Zhang, Shanghai (CN)

(73) Assignee: New Focus Lighting & Power Technology (Shanghai) Co., Ltd., Shanghai (CN)

( * ) Notice: Subject to any disclaimer, the term of this patent is extended or adjusted under 35 U.S.C. 154(b) by 0 days. days.

(21) Appl. No.: 15/308,809

(22) PCT Filed: Nov. 21, 2014

(86) PCT No.: PCT/CN2014/091892
§ 371 (c)(1),
(2) Date: Nov. 3, 2016

(87) PCT Pub. No.: WO2016/078078
PCT Pub. Date: May 26, 2016

(65) Prior Publication Data
US 2017/0248658 A1    Aug. 31, 2017

(30) Foreign Application Priority Data
Nov. 19, 2014 (CN) .......................... 2014 1 0664710

(51) Int. Cl.
*H02J 7/04* (2006.01)
*H02J 7/16* (2006.01)
(Continued)

(52) U.S. Cl.
CPC ....... *G01R 31/3631* (2013.01); *G01R 31/006* (2013.01); *H01M 10/06* (2013.01);
(Continued)

(58) Field of Classification Search
CPC .................................................. G01R 19/00
(Continued)

(56) References Cited

U.S. PATENT DOCUMENTS

| 6,144,185 A | * | 11/2000 | Dougherty | ......... | G01R 31/3631 320/132 |
| 2013/0311124 A1 | * | 11/2013 | van Bremen | ..... | H01M 10/4207 702/104 |

FOREIGN PATENT DOCUMENTS

| CN | 102403752 A | 4/2012 |
| CN | 202854303 U | 4/2013 |

(Continued)

OTHER PUBLICATIONS

International Search Report issued for PCT Application No. PCT/CN2014/091892, dated Jun. 15, 2015, 2 pages.

*Primary Examiner* — Edward Tso
*Assistant Examiner* — Ahmed Omar
(74) *Attorney, Agent, or Firm* — Sprinkle IP Law Group

(57) ABSTRACT

A charger system for battery starting current test, comprising: a battery equivalent circuit comprising a battery internal resistance R0 and an electromotive force E connected in series, two ends of the battery equivalent circuit are connected to a first signal and a second signal, respectively; a signal drive circuit, comprising a first DC output signal and a second DC output signal, and a first load circuit and a second load circuit configured between the first DC output signal and the second DC output signal, each load circuit is connected to the battery equivalent circuit and controlled by a first drive signal and a second drive signal; an intermediate resistor R28, configured between the signal drive circuit and the battery equivalent circuit. This invention uses the above technical solution to test the internal resistance of the battery, and find out the CCA value of the battery via the internal resistance correspondingly.

13 Claims, 3 Drawing Sheets

(51) Int. Cl.
    *H02J 7/24*           (2006.01)
    *G01N 27/416*       (2006.01)
    *G01R 31/36*        (2006.01)
    *G01R 31/00*        (2006.01)
    *H02J 7/00*           (2006.01)
    *H01M 10/44*        (2006.01)
    *H01M 10/06*        (2006.01)

(52) U.S. Cl.
    CPC ........... *H01M 10/446* (2013.01); *H02J 7/007* (2013.01); *H01M 2220/20* (2013.01)

(58) Field of Classification Search
    USPC ......................................................... 320/162
    See application file for complete search history.

(56) References Cited

FOREIGN PATENT DOCUMENTS

| | | |
|---|---|---|
| CN | 104062506 A | 9/2014 |
| CN | 104062507 A | 9/2014 |
| CN | 204304488 U | 4/2015 |
| JP | 2010230659 A | 10/2010 |

\* cited by examiner

CHARGER SYSTEM FOR BATTERY STARTING CURRENT TEST

CROSS-REFERENCE TO RELATED APPLICATIONS

The present application claims priority to and the benefit of Chinese Patent Application No. CN 201410664710.4, filed on Nov. 19, 2014, the entire content of which is incorporated herein by reference.

BACKGROUND OF THE INVENTION

1. Field of the Invention

The present invention relates to a control system of battery energy storage device, more particularly to an intelligent charger system of lead-acid battery, and especially to a charger system for testing battery starting current of automobile.

2. Description of the Related Art

With the increase of national income, automobile consumer goods have been available for common people, which bring convenience to work and life. With the increase of the usage of automobiles, car interior consumer terms also need to be replaced regularly. Wherein, the lead-acid battery for starting the car is one of the consumer terms, the service life thereof is generally 2-3 years. In the production of the lead-acid battery, it uses in large doses of acidic electrolyte and the metal lead and oxides thereof, which do great harm to the environment especially water resources. During the use of automobiles, the battery starting discharge current needs to be tested regularly; if the test results reflect the battery is of power shortage, the charger must be promptly charged, in some alternative conditions, the battery can be repaired such as by devulcanization when needed, which will greatly extend the service life of the battery and has good economic and social benefits.

For testing the cold-cranking ampere (hereinafter referred to as CCA) of the battery, the international has a specific method: putting the battery finished charging into the environment of −18° C., and discharging to a cut-off voltage (such as 7.2V) at a fixed current value for predetermined 30 seconds, and the maximum fixed current value is the CCA value. For vehicles with different displacement, the CCA value of the battery thereof can be from 300 to 1000 A or more, therefore if using the standard method, testing the discharge resistance may cause problems as follows: 1, a number of high-power resistors need to be configured; 2, the high-current discharge test will adversely affect the battery life; 3, batteries for track loading need to be removed before being tested, and there are many other issues

SUMMARY OF THE INVENTION

A charger system for testing battery starting current, comprising:

a battery equivalent circuit, comprising a battery internal resistance R0 and an electromotive force E connected in series, and two ends of the battery equivalent circuit are connected to a first signal (signal +) and a second signal (signal −) respectively;

a signal drive circuit, comprising a first DC output signal and a second DC output signal, and a first load circuit and a second load circuit being configured between the first DC output signal and the second DC output signal, each of the load circuits is connected to the battery equivalent circuit and controlled by a first drive signal (drive signal 1) and a second drive signal (drive signal 2) respectively; and an intermediate resistor R28, configured between the signal drive circuit and the battery equivalent circuit;

wherein the first DC output signal and the first signal (signal +) are connected to a positive electrode of the battery, and the second DC output signal and the second signal (signal −) are connected to a negative electrode of the battery.

As the above-mentioned charger system, wherein in the first load circuit, the first drive signal is connected to a base electrode of a first triode (Q3), an emitter electrode of the first triode (Q3) is grounded, and a collector electrode thereof is connected to a control terminal of a first switching tube (Q1);

a first resistor module is configured between the first DC output signal (DC output +) and the first switching tube (Q1); and the source of the first switching tube (Q1) is connected to the second DC output signal (DC output −).

As the above-mentioned charger system, wherein a resistor (R21) is configured between the base electrode of the first triode (Q3) and the first drive signal, and also two resistors (R10, R19) are connected in series between the collector electrode of the first triode (Q3) and the first drive signal, a node between the two resistors is connected to a supply voltage VCC, the emitter electrode of the first triode (Q3) is grounded, and a resistor (R6) is also configured between the first triode (Q3) and the first switching tube (Q1);

a reverse blocking diode (D1) is configured between the first DC output signal and the first resistor module; and the first resistor module comprises a plurality of resistors (R6, R7, R8) connected in parallel.

As the above-mentioned charger system, wherein in the second load circuit, the second drive signal is connected to a base electrode of a second triode (Q4), an emitter electrode of the second triode is grounded, and a collector electrode thereof is connected to the control terminal of a second switching tube (Q2);

a second resistor module (R9) is configured between the first DC output signal (DC output +) and the second switching tube (Q2); and a source of the second switching tube (Q2) is connected to the second DC output signal (DC output −).

As the above-mentioned charger system, wherein a resistor (R24) is configured between the base electrode of the second triode (Q4) and the second drive signal, and also two resistors (R22, R23) are connected in series between the collector electrode of the second triode (Q4) and the second drive signal, the node between the two resistors is connected to a supply voltage VCC, the emitter electrode of the second triode (Q4) is grounded, a resistor (R2) is also configured between the second triode (Q4) and the second switching tube (Q2);

a reverse blocking diode (D2) is configured between the first DC output signal and the second resistor module (R9).

As the above-mentioned charger system, wherein in the first load circuit, the voltage difference between the first signal (signal +) and the second signal (signal −) is U1, and the resistance value of the first resistor module is $R_{m1}$;

$$\frac{E}{R0 + R28 + R_{ml}} = \frac{E - U1}{R28 + R_{ml}} \qquad \text{①}$$

in the second load circuit, the voltage difference between the first signal (signal +) and the second signal (signal −) is U2;

$$\frac{E}{R0 + R28 + R9} = \frac{E - U2}{R28 + R9} \qquad ②$$

the battery internal resistance R0 is conversed according to the formula ① and the formula ②:

$$R0 = \frac{|R_{ml} - R9|U1U2}{E(U1 - U2)}. \qquad ③$$

As the above-mentioned charger system, wherein the system further comprises a signal amplifying circuit;

the first signal (signal +) is connected to a positive phase input terminal of a first voltage follower (U1A) via a capacitor (C1), and the second signal (signal −) is connected to the positive phase input terminal of a second voltage follower (U1D) via a capacitor (C2);

between the first signal (signal +) and the first voltage follower (U1A), and between the second signal (signal −) and the second voltage follower (U1D), and a bleeder circuit is provided to provide DC bias;

an output end of the first voltage follower (U1A) and an output end of the second voltage follower (U1D) are connected to two input ends of a subtracter (U1B) respectively, to amplify signal, and an output end of the subtracter (U1B) is connected to the positive phase input terminal of an amplifier (U1C), to further amplify signal output from the subtracter (U1B).

As the above-mentioned charger system, wherein the bleeder circuit configured between the first signal (signal +) and the first voltage follower (U1A) comprises:

two resistors connected in series between a supply voltage VCC and a ground terminal GND;

the bleeder circuit configured between the second signal (signal −) and the second voltage follower (U1D) comprises:

two resistors (R18, R17) connected in series between a supply voltage VCC and a ground terminal GND, and a resistor (R16) is connected in parallel with the resistor (R17) connected to the ground terminal.

As the above-mentioned charger system, wherein output ends of the first voltage follower (U1A), the second voltage follower (U1D), the subtracter (U1B) and the amplifier (U1C) all provide feedback signal to their respective inverting input ends.

As the above-mentioned charger system, wherein current passing through the first DC output signal and the second DC output signal is greater than current passing through the first signal (signal +) and the second signal (signal −).

As the above-mentioned charger system, wherein further comprises a regulated power supply circuit, converting the first DC output signal and the second DC output signal through a Zener diode (VR1) and providing a stable voltage reference source VREF.

As the above-mentioned charger system, wherein in the regulated power supply circuit, the first DC output signal is connected to a linear regulator (U2) via a diode (D3), and a capacitor (C3) is configured between the input end of the linear regulator (U2) and the ground terminal, and a capacitor (C4) is configured between the output end of the linear regulator (U2) and the ground terminal.

BRIEF DESCRIPTIONS OF THE DRAWINGS

The accompanying drawings, together with the specification, illustrate exemplary embodiments of the present disclosure, and, together with the description, serve to explain the principles of the present invention.

DETAILED DESCRIPTION

Figure 1:
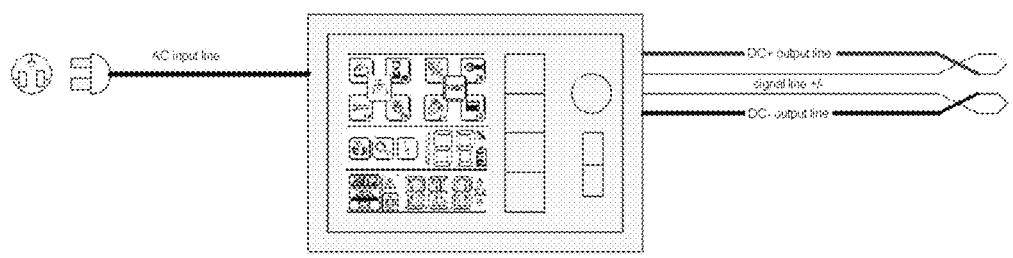
FIG. 1 shows an intelligent charger structure with battery diagnosing and repairing function of the present invention.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "plurality" means a number greater than one.

Hereinafter, certain exemplary embodiments according to the present disclosure will be described with reference to the accompanying drawings.

The present invention provides a charger system for testing battery starting current; first of all, providing signals by means of the device shown in FIG. 1. As shown in FIG. 1, one end of the device is an AC (alternating current) input line, the other end thereof is provided with two lead wires with clips connected to the positive terminal and the negative terminal of the battery respectively. Wherein, the DC (direct current) + output line as shown in FIG. 1 is clamped to the positive electrode of the battery, and the DC− output line is clamped to the negative electrode of the battery. In addition, as the two lead wires clamped to the positive and the negative terminals of the battery, the signal + line and the signal − line are also connected to the positive and the negative electrode terminals of the battery, respectively. Thus, on the positive and the negative electrode terminals, the positive electrode has two lines which are the DC + output line and the signal + line, and the DC + output line is used to pass large current. Similarly, the negative electrode has two lines which are the DC− output line and the signal − line, and the DC− output line is used to pass large current.

Figure 3:
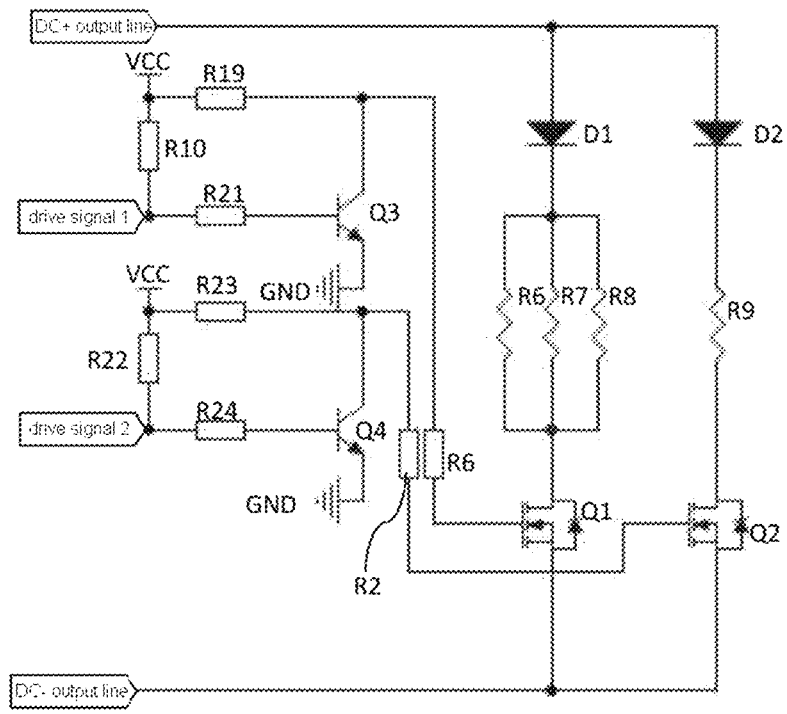
FIG. 3 shows a partial structure diagram of the main circuit of an intelligent charger with battery diagnosing and repairing function of the present invention.
Figure 5:
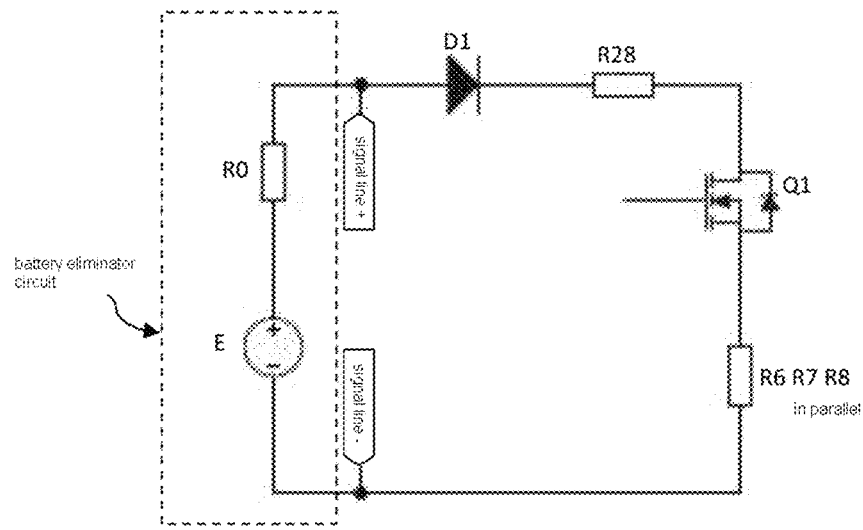
FIGS. 5-6 show diagrams of the equivalent circuit for CAA test of the intelligent charger with battery diagnosing and repairing function of the present invention on conditions with the first load circuit and the second load circuit.
Figure 6:
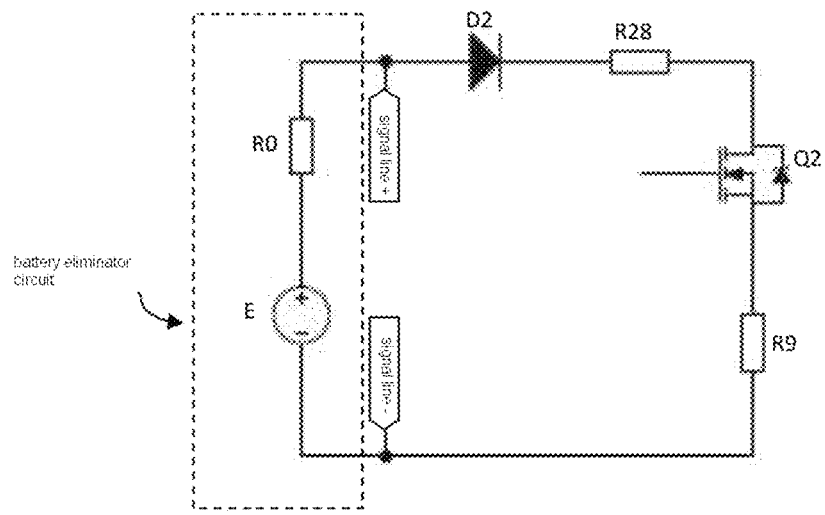

The charger system for testing battery starting current provided by the present invention shown in FIG. 5 and FIG. 6 comprises:

a battery equivalent circuit, comprising a battery internal resistance R0 and an electromotive force E connected in series, and two ends of the battery equivalent circuit are connected to a first signal (i.e. the signal line + in FIGS. 5-6) and a second signal (i.e. the signal line − in FIGS. 5-6), respectively;

a signal drive circuit, referring to FIG. 3, comprises a first DC output signal (i.e. the DC + signal line) and a second DC output signal (i.e. the DC − signal line), and a first load circuit and a second load circuit configured between the first DC output signal and the second DC output signal, each of the load circuits is connected to the battery equivalent circuit and controlled by a first drive signal (i.e. the drive signal 1 in FIGS. 5-6) and a second drive signal (i.e. the drive signal 2 in FIGS. 5-6), respectively, when one of the load circuits is turned on, the other load circuit is turned off.

An intermediate resistor R28, configured between the signal drive circuit and the battery equivalent circuit. The R28 is an equivalent value of the contact resistance in the circuit shown in FIGS. 5-6.

In an alternative embodiment of the present invention, in the first load circuit, the drive signal 1 is connected to the base electrode of the first triode Q3, and the emitter electrode of the first triode Q3 is connected to the ground terminal GND, and the collector electrode thereof is connected to the control terminal of the first switching tube Q1;

a first resistor module is configured between the first DC output signal and the first switching tube Q1;

the source of the first switching tube Q1 is connected to the second DC output signal (DC output line −).

The first switching tube Q1 is as an electronic switch in the first load circuit and controlled by the drive signal 1 correspondingly.

In an alternative embodiment of the present invention, referring to FIG. 3, a resistor R21 is configured between the base electrode of the first triode Q3 and the first drive signal, and also two resistors R10 and R19 are connected in series between the collector electrode of the first triode Q3 and the first drive signal, the node between the two resistors is connected to a supply voltage VCC, the emitter electrode of the first triode Q3 is grounded, and a resistor R6 is configured between the first triode Q3 and the first switching tube Q1; a reverse blocking diode D1 is configured between the first DC output signal and the first resistor module; the first resistor module comprises a plurality of resistors connected in parallel, such as the cement resistors R6, R7 and R8 in parallel in FIG. 3. Alternatively but not restrictively, after the cement resistors R6, R7 and R8 being connected in parallel, the resistance of the cement resistors R6, R7 and R8 is 6 ohms.

In an alternative embodiment of the present invention, referring to FIG. 3, in the second load circuit, the drive signal 2 is connected to the base electrode of a second triode Q4, the emitter electrode of the second triode Q4 is connected to the ground terminal GND, and the collector electrode thereof is connected to the control terminal of the second switching tube Q2. Alternatively, a second resistor module is configured between the first DC output signal and the second switching tube Q2. Alternatively but not restrictively, the second resistor module is a single resistor R9. The resistance of the single resistor R9 is 10 ohms. The source of the second switching tube Q2 is connected to the second DC output signal (DC output −). The second switching tube Q2 is as an electronic switch in the second load circuit and controlled by the drive signal 2 correspondingly.

In an alternative embodiment of the present invention, a resistor R24 is configured between the base electrode of the second triode Q4 and the second drive signal, and also two resistors R22 and R23 are connected in series between the collector electrode of the second triode Q4 and the second drive signal, and the node between the two resistors R22 and R23 is connected to the supply voltage VCC, the emitter electrode of the second triode Q4 is grounded, and a resistor R2 is configured between the collector electrode of the second triode Q4 and the second switching tube Q2. A reverse blocking diode D2 is configured between the first DC output signal and the resistor R9.

The above-mentioned drive signal 1 and the drive signal 2 are two independent signals, which respectively output at different time during the test, and both come from the I/O port of the MCU, so as to achieve controlling one of the load circuits to be turned on, i.e. when the switching tube Q1 is turned on, the switching tube Q2 is turned off; on the contrary, when the switching tube Q1 is turned off, the switching tube Q2 is turned on. Alternatively but not restrictively, the two signals are both square waves, of which the period is 10 ms. Alternatively but not restrictively, the switching tube Q1 and the switching tube Q2 are both MOS (metal-oxide-semiconductor) transistors.

The battery may be equivalent to the form of the electromotive force E plus the battery internal resistance R0, when being tested, as shown in FIGS. 5 and 6. The internal resistance of a battery at normal use is generally between several milliohms to decades of milliohms, so the loaded 6 ohms or 10 ohms resistance is much greater than the internal resistance of the battery. According to Ohm's law, two equalities can be listed, and regarding the R28 as the error value of all the contact resistance and resistors, the R28 can be eliminate in the simultaneous equations, and then the battery internal resistance R0 can be obtained.

According to FIGS. 3, 5 and 6, in the first load circuit, the voltage difference between the first signal (signal +) and the second signal (signal −) is U1, and the resistance value of the first resistor module is $R_{m1}$, so the formula can be obtained:

$$\frac{E}{R0 + R28 + R_{m1}} = \frac{E - U1}{R28 + R_{m1}} \qquad (1)$$

in the second load circuit, the voltage difference between the first signal (signal +) and the second signal (signal −) is U2, so the formula can be obtained:

$$\frac{E}{R0 + R28 + R9} = \frac{E - U2}{R28 + R9} \quad (2)$$

the battery internal resistance R0 can be obtained according to the formula ① and the formula ②:

$$R0 = \frac{|R_{ml} - R9|U1U2}{E(U1 - U2)}. \quad (3)$$

In an alternative embodiment, the value of U1 can be calculated via the signal, which is output from an amplifier U1C said below, divided by 30 times of the amplification factor.

In an embodiment already mentioned above, the resistance value of the first resistor module in the first load circuit is 6 ohms (i.e. the resistance of the resistors R6, R7, R8, which are connected in parallel, is 6 ohms), the resistance value of the resistor R9 in the second load circuit is 10 ohms, and then it can be drawn:

$$\frac{E}{R0 + R28 + 6} = \frac{E - U1}{R28 + 6} \quad (1)$$

$$\frac{E}{R0 + R28 + 10} = \frac{E - U2}{R28 + 10} \quad (2)$$

$$\text{calculated: } R0 = \frac{4U1U2}{E(U1 - U2)}. \quad (3)$$

The battery internal resistance R0 can be calculated via simultaneous of the formulas ① and ②, through the method of checking the correspondence table of the battery internal resistance and the CCA value, the CCA value can be quickly obtained. There is a standard in this field, which is the battery internal resistance value R0 and the CCA value are of one-to-one correspondence, therefore the CCA value will be obtained once the battery internal resistance R0 is obtained, so this will not be detailed here.

Figure 4:
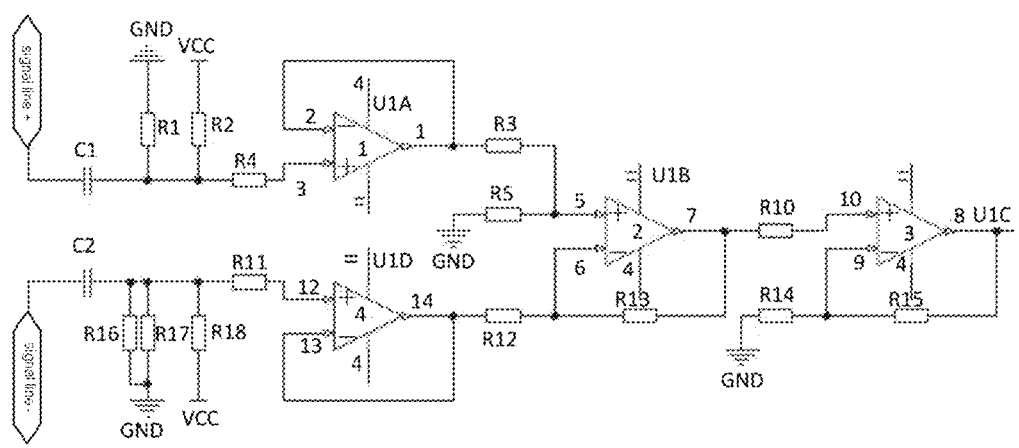
FIG. 4 shows a diagram of the signal amplification part of an intelligent charger with battery diagnosing and repairing function of the present invention.

In an alternative embodiment of the present invention, the system provided by the present invention further comprises a signal amplifying circuit; referring to FIG. 4, the first signal (signal +) is connected to the positive phase input terminal of a first voltage follower U1A via a capacitor C1, and the second signal (signal −) is connected to the positive phase input terminal of a second voltage follower U1D via a capacitor C2; between the first signal (signal +) and the first voltage follower U1A; and between the second signal (signal −) and the second voltage follower U1D, a bleeder circuit is configured to provide DC bias; the output ends of the first voltage follower U1A and the second voltage follower U1D are connected to two input ends of a subtracter U1B, to amplify the signal, and the output end of the subtracter U1B is connected to the positive phase input terminal of an amplifier U1C, to further amplify the signal.

Wherein a resistor R3 is configured between the output end of the first voltage follower U1A and the positive phase input terminal of the subtracter U1B; similarly, a resistor R12 is configured between the output end of the second voltage follower U1D and the inverting input end of the subtracter U1B, and the positive phase input terminal of the subtracter U1B is connected to the ground terminal GND through a resistor R5. A resistor R10 is configured between the output end of the subtracter U1B and the positive phase input terminal of the amplifier U1C. In addition, the inverting input end of the amplifier U1C is connected to the ground terminal GND through a resistor R14.

Alternatively but not restrictively, continue to refer to FIG. 4, the bleeder circuit configured between the first signal (signal +) and the first voltage follower U1A comprises:

two resistors R1 and R2 connected in series between the supply voltage VCC and the ground terminal GND, to provide DC bias;

the bleeder circuit configured between the second signal (signal −) and the second voltage follower U1D comprises:

two resistors R18 and R17 connected in series between the supply voltage VCC and the ground terminal GND, and a resistor R16 is connected in parallel with the resistor R17 connected to the ground terminal, to provide DC bias.

In an alternative embodiment of the present invention, output ends of the first voltage follower U1A, the second voltage follower U1D, the subtracter U1B and the amplifier U1C all provide a feedback signal to their respective inverting input ends. Wherein a resistor R13 is configured between the output end and the inverting input end of the subtracter U1B, a resistor R15 is configured between the output end and the inverting input end of the amplifier U1C.

Continue to refer to FIG. 4, the signal line + and the signal line − are connected to the positive and the negative electrodes of the battery respectively. The AC signal component of the signal line + and the signal line − is coupled into the non-inverting input ends of U1A and U1D through the two capacitors C1 and C2 respectively. The bleeder circuit made of R1 and R2, and R16, R17 and R18 provides DC bias. The DC voltage of the pin U1A-3 is 0.065V higher than the DC voltage of the pin U1D-12; the DC signals are input into the non-inverting and the inverting input ends of the U1B through the two voltage followers U1A and U1D, and the U1B is designed as a subtracter. After 5 times of signal amplification of the amplifier U1B and 6 times of signal amplification of the amplifier U1C, the DC component will generate DC voltage of about 1.96V at the output end of the U1C.

In an alternative embodiment of the present invention, the current passing through the first DC output signal and the second DC output signal is both greater than the current passing through the first signal (signal +) and the second signal (signal −).

Figure 2:
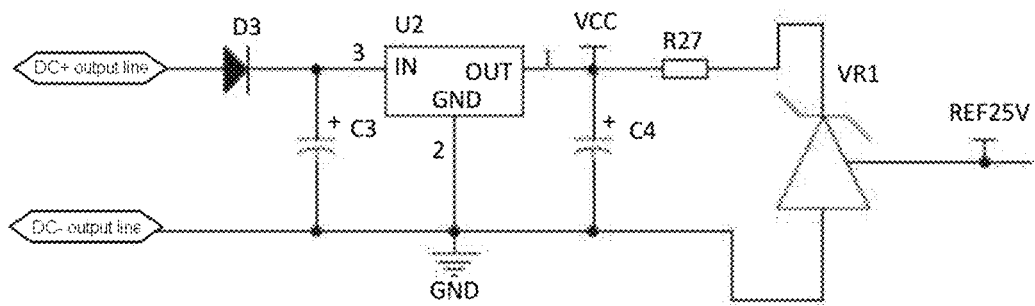
FIG. 2 shows a structure diagram of the regulated power supply of the present invention.

In an alternative embodiment of the present invention, further comprise a regulated power supply circuit; as shown in FIG. 2, the testing system uses the TX7550 type LDO to provide +5V (VCC) power to MCU, operational amplifier and so on; at the same time the VR1 uses the TL431 to provide 2.5V voltage reference source with the accuracy of 0.2%, which is also used to calibrate the voltage value for A/D conversion. Referring to FIG. 2, the Zener diode VR1 converts the first DC output signal and the second DC output signal and provides a stable voltage reference source REF. For example, in an embodiment of the present invention, a stable voltage reference source REF of 25V is output.

In an alternative embodiment of the present invention, continue to refer to FIG. 2; in the regulated power supply circuit, the first DC output signal is connected to a linear regulator U2 via a diode D3, which has an input end (IN), an output end (OUT) and a ground terminal (GND), and also a capacitor C3 is configured between the input end and the ground terminal, and a capacitor C4 is configured between the output end and the ground terminal. Wherein, a power supply voltage VCC and also a resistor R27 is configured between the output end of the linear regulator U2 and the Zener diode VR1.

The present invention uses the above technical solution to test the internal resistance of the battery, and find out the CCA value via the internal resistance of the battery correspondingly; compared with the prior art, the present invention has the following beneficial effects:

1, low hardware cost of testing the CCA of the lead-acid battery, and LCD can be used to display the test data intuitively, which has a better practicability;

2, the battery life will not be affected when testing the CCA of the lead-acid battery;

3, recommendations will be given to the users when tested performance of the lead-acid battery is poor; the battery can be automatically charged and repaired if needed, which provides a strong flexibility.

While the present disclosure has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A charger system for testing battery starting current, comprising:
   a battery equivalent circuit, comprising a battery internal resistance R0 and an electromotive force E connected in series, and two ends of the battery equivalent circuit are connected to a first signal (signal +) and a second signal (signal −) respectively;
   a signal drive circuit, comprising a first DC output signal and a second DC output signal, and a first load circuit and a second load circuit being configured between the first DC output signal and the second DC output signal, each of the load circuits is connected to the battery equivalent circuit and controlled by a first drive signal (drive signal 1) and a second drive signal (drive signal 2) respectively; and
   an intermediate resistor R28, configured between the signal drive circuit and the battery equivalent circuit;
   wherein the first DC output signal and the first signal (signal +) are connected to a positive electrode of the battery, and the second DC output signal and the second signal (signal −) are connected to a negative electrode of the battery.

2. The charger system according to claim 1, wherein in the first load circuit,
   the first drive signal is connected to a base electrode of a first triode (Q3), an emitter electrode of the first triode (Q3) is grounded, and a collector electrode thereof is connected to a control terminal of a first switching tube (Q1);
   a first resistor module is configured between the first DC output signal (DC output +) and the first switching tube (Q1); and
   the source of the first switching tube (Q1) is connected to the second DC output signal (DC output −).

3. The charger system according to claim 2, wherein a resistor (R21) is configured between the base electrode of the first triode (Q3) and the first drive signal, and also two resistors (R10, R19) are connected in series between the collector electrode of the first triode (Q3) and the first drive signal, a node between the two resistors is connected to a supply voltage VCC, the emitter electrode of the first triode (Q3) is grounded, and a resistor (R6) is also configured between the first triode (Q3) and the first switching tube (Q1);
   a reverse blocking diode (D1) is configured between the first DC output signal and the first resistor module; and
   the first resistor module comprises a plurality of resistors (R6, R7, R8) connected in parallel.

4. The charger system according to claim 1, wherein in the second load circuit,
   the second drive signal is connected to a base electrode of a second triode (Q4), an emitter electrode of the second triode is grounded, and a collector electrode thereof is connected to the control terminal of a second switching tube (Q2);
   a second resistor module (R9) is configured between the first DC output signal (DC output +) and the second switching tube (Q2); and
   a source of the second switching tube (Q2) is connected to the second DC output signal (DC output −).

5. The charger system according to claim 4, wherein a resistor (R24) is configured between the base electrode of the second triode (Q4) and the second drive signal, and also two resistors (R22, R23) are connected in series between the collector electrode of the second triode (Q4) and the second drive signal, the node between the two resistors is connected to a supply voltage VCC, the emitter electrode of the second triode (Q4) is grounded, a resistor (R2) is also configured between the second triode (Q4) and the second switching tube (Q2);
   a reverse blocking diode (D2) is configured between the first DC output signal and the second resistor module (R9).

6. The charger system according to claim 2, wherein in the first load circuit, the voltage difference between the first signal (signal +) and the second signal (signal −) is U1, and the resistance value of the first resistor module is $R_{m1}$;

$$\frac{E}{R0 + R28 + R_{ml}} = \frac{E - U1}{R28 + R_{ml}} \qquad (1)$$

in the second load circuit, the voltage difference between the first signal (signal +) and the second signal (signal −) is U2;

$$\frac{E}{R0 + R28 + R9} = \frac{E - U2}{R28 + R9} \qquad (2)$$

the battery internal resistance R0 is conversed according to the formula ① and the formula ②:

$$R0 = \frac{|R_{ml} - R9|U1U2}{E(U1 - U2)}. \qquad (3)$$

7. The charger system according to claim 4, wherein in the first load circuit, the voltage difference between the first signal (signal +) and the second signal (signal −) is U1, and the resistance value of the first resistor module is $R_{m1}$;

$$\frac{E}{R0 + R28 + R_{ml}} = \frac{E - U1}{R28 + R_{ml}} \qquad (1)$$

in the second load circuit, the voltage difference between the first signal (signal +) and the second signal (signal −) is U2;

$$\frac{E}{R0 + R28 + R9} = \frac{E - U2}{R28 + R9} \qquad (2)$$

the battery internal resistance R0 is conversed according to the formula (1) and the formula (2):

$$R0 = \frac{|R_{ml} - R9|U1U2}{E(U1 - U2)}. \qquad (3)$$

8. The charger system according to claim 1, wherein the system further comprises a signal amplifying circuit;
the first signal (signal +) is connected to a positive phase input terminal of a first voltage follower (U1A) via a capacitor (C1), and the second signal (signal −) is connected to the positive phase input terminal of a second voltage follower (U1D) via a capacitor (C2);
between the first signal (signal +) and the first voltage follower (U1A), and between the second signal (signal −) and the second voltage follower (U1D), and a bleeder circuit is provided to provide DC bias;
an output end of the first voltage follower (U1A) and an output end of the second voltage follower (U1D) are connected to two input ends of a subtracter (U1B) respectively, to amplify signal, and an output end of the subtracter (U1B) is connected to the positive phase input terminal of an amplifier (U1C), to further amplify signal output from the subtracter (U1B).

9. The charger system according to claim 8, wherein the bleeder circuit configured between the first signal (signal +) and the first voltage follower (U1A) comprises:
two resistors connected in series between a supply voltage VCC and a ground terminal GND;
the bleeder circuit configured between the second signal (signal −) and the second voltage follower (U1D) comprises:
two resistors (R18, R17) connected in series between a supply voltage VCC and a ground terminal GND, and a resistor (R16) is connected in parallel with the resistor (R17) connected to the ground terminal.

10. The charger system according to claim 8, wherein output ends of the first voltage follower (U1A), the second voltage follower (U1D), the subtracter (U1B) and the amplifier (U1C) all provide feedback signal to their respective inverting input ends.

11. The charger system according to claim 1, wherein current passing through the first DC output signal and the second DC output signal is greater than current passing through the first signal (signal +) and the second signal (signal −).

12. The charger system according to claim 1, wherein further comprises a regulated power supply circuit, converting the first DC output signal and the second DC output signal through a Zener diode (VR1), and providing a stable voltage reference source VREF.

13. The charger system according to claim 12, wherein in the regulated power supply circuit, the first DC output signal is connected to a linear regulator (U2) via a diode (D3), and a capacitor (C3) is configured between the input end of the linear regulator (U2) and the ground terminal, and a capacitor (C4) is configured between the output end of the linear regulator (U2) and the ground terminal.

* * * * *